(12) United States Patent
Keller et al.

(10) Patent No.: US 7,230,231 B2
(45) Date of Patent: Jun. 12, 2007

(54) MEDICAL DEVICE WITH PARTIALLY TRANSPARENT HOUSING

(75) Inventors: Michael Keller, Gauting (DE); Helmut Pauser, Diessen (DE); Martin Hartung, München (DE)

(73) Assignee: 3M ESPE AG, Seefeld (DE)

( * ) Notice: Subject to any disclaimer, the term of this patent is extended or adjusted under 35 U.S.C. 154(b) by 215 days.

(21) Appl. No.: 10/432,869

(22) PCT Filed: Nov. 26, 2001

(86) PCT No.: PCT/EP01/13703

§ 371 (c)(1),
(2), (4) Date: May 28, 2003

(87) PCT Pub. No.: WO02/45095

PCT Pub. Date: Jun. 6, 2002

(65) Prior Publication Data

US 2004/0012967 A1    Jan. 22, 2004

(30) Foreign Application Priority Data

Nov. 28, 2000 (DE) ................................ 100 59 068

(51) Int. Cl.
*F21V 5/00* (2006.01)
(52) U.S. Cl. ................ 250/239; 250/221; 362/311
(58) Field of Classification Search ................ 250/221, 250/216, 239; 345/173, 175, 176; 341/20, 341/22, 31; 362/23, 29
See application file for complete search history.

(56) References Cited

U.S. PATENT DOCUMENTS

| 4,012,632 A | * | 3/1977 | Stone ........................... 362/23 |
| 4,321,655 A | * | 3/1982 | Bouvrande .................... 362/29 |
| 4,340,813 A | * | 7/1982 | Sauer .......................... 250/221 |
| 5,886,338 A | * | 3/1999 | Arackellian et al. ... 235/472.01 |
| 5,907,267 A |   | 5/1999 | Reid et al. ..................... 335/17 |

FOREIGN PATENT DOCUMENTS

| AU | B-64662/90 | 5/1991 |
| DE | 8712960.4  | 2/1988 |
| EP | 0700241    | 3/1996 |
| JP | 8-167731   | 6/1996 |
| JP | 9-103359   | 4/1997 |
| JP | 10-260505  | 9/1998 |
| JP | 11023010   | 1/1999 |

OTHER PUBLICATIONS

Search Report.

* cited by examiner

*Primary Examiner*—Thanh X. Luu
*Assistant Examiner*—Stephen Yam
(74) *Attorney, Agent, or Firm*—Crowell & Moring LLP

(57) ABSTRACT

A device is provided having a housing with a housing wall consisting of a non-transparent plastic with an outer surface and an inner surface; and an operating mode display unit with at least one light-emitting element which is/are located inside the housing, underneath the inner surface of the housing wall. The housing wall has at least one recess in the area of the light-emitting element and the light intensity of the at least one light-emitting element is adjusted in such a way that in its light-emitting mode, said at least one light-emitting element is only optically perceptible in a localizable manner through the housing wall in this area.

8 Claims, 1 Drawing Sheet

MEDICAL DEVICE WITH PARTIALLY TRANSPARENT HOUSING

BACKGROUND AND SUMMARY OF THE INVENTION

The invention relates to a device, comprising a housing and a display unit, which can be optically perceived through the housing wall. The device is preferably a medical device.

There are known illuminated switches with a housing, as described in U.S. Pat. No. 4,778,967. An illuminated operating element, such as a button, which has a receptacle made of transparent material and acts as a light guide is known from DE 37 15 528 C2.

The prior art also discloses devices comprising a housing and a display unit with light-emitting elements, the light-emitting elements usually being optically perceptible through a window which is fitted in a clearance in the housing wall.

Such devices are customary in particular in the medical sector, in cases where it is desired to make information optically perceptible.

The disadvantage of such devices is that, owing to the window made in the housing wall, there are crevices, fissures or recesses in the housing wall, which easily become soiled but can only be cleaned, in particular disinfected, with great difficulty.

Added to this is the fact that, owing to the considerable number of parts, these devices are relatively complicated to produce and consequently lead to relatively high costs in production.

Consequently, it is an object of the present invention to provide a device which avoids these problems.

It can be regarded as a further object to provide a device which permits the detection of items in the vicinity of the device.

This object is achieved by a device such as that described in the claims.

The terms "comprise" or "include" introduce a list of features which is not considered to be exhaustive. The fact that the word "a" is used in the claims before stating a feature does not exclude the possibility that the features stated may be present as a plurality, in the sense of "at least one".

The invention has the following advantages:

The device according to the invention can be cleaned easily and effectively, since the device does not have to have clearances in the area of the display unit for incorporating a window in order for the light-emitting elements to be optically perceptible.

The largely uninterrupted surface of the housing of the device has the effect of making production easier, since no cutouts need be made in the housing.

For the purposes of the present invention, a housing is understood as meaning any external enclosure of a device which has any light-emitting display unit. The housing may be produced from just one part and consist of one and the same material, but may also be made up of different elements, which for their part contain different materials.

The primary purpose of the housing is to protect the components located in the housing from external influences, in particular mechanical influences. In this respect, the housing is preferably produced from a material that is resistant to rupture. The housing is preferably also largely encapsulated and, apart from necessary apertures in the form of ventilation slits or apertures for cables, has no openings.

The housing wall is preferably made from one and the same material. The housing wall is predominantly of the same thickness. Housing wall thicknesses in the range from 1 to 5 mm, preferably from 2 to 3 mm, are customary.

The term non-transparent comprises materials which, when held against a dark surface, under normal lighting intensity do not allow this surface to be optically perceived, preferably by the human eye or an optical sensor, for example a photocell, through the material. Consequently, translucent materials such as acrylic glass are not included.

A display unit is to be understood as meaning electrically operable component parts of a device which optically displays information on some operating state or other of the device. Such information may be, for example, the charging state of the batteries of a battery-operated device, information on the light intensity given off by an illuminating device, the on state, the operating mode or error messages.

The term light-emitting elements comprises all elements which, when operated with electric current, can emit light, such as incandescent lamps, light-emitting diodes (LEDs), 7-segment displays and/or laser diodes.

The radiation transmitted by the light-emitting elements lies in the range from 400 to 1300 nm. For use as a display, wavelengths in the range from 400 to 700 nm have proven successful; for the application for detecting items, wavelengths in the range from 600 to 1300 nm have proven successful.

The radiant power lies, for example, in the range from 0.1 to 30 mW, preferably in the range from 1 to 10 mW.

The device according to the invention has at least one light-emitting element, preferably two, three or more light-emitting elements.

For the purposes of the invention, optically perceptible means that, under customary artificial or natural lighting, it can be perceived, preferably with the human eye, whether or not a light-emitting element is radiating light. Depending on the desired embodiment, however, radiation sensors such as photocells, photodiodes or phototransistors may also be used for the optical perception.

The presence of a light-emitting element is not perceptible from the outside in the non-emitting state, whereas in the emitting state the emission of the light-emitting element is optically perceptible from the outside through the housing wall in an area which can largely be sharply delimited. This must be distinguished from a diffuse emission, which cannot be clearly assigned to an area which can be delimited, as is known for example in the case of internally illuminated switches.

Of course, the device also has a switching unit, by means of which the device can, for example, be put into the operating state. The switching unit may be formed as a power switch, a changeover switch and/or an on switch. The switching unit is usually in the form of a pushbutton, a toggle switch or a rotary switch. The housing usually has no clearance at this point.

The optical perceptibility of the light-emitting elements is achieved through the housing wall by reducing the wall thickness of the housing wall, preferably on the inner side of the housing. This leads to a reduction in the layer thickness of the housing wall (recess) and consequently to an increase in the transparency at this point.

For the purposes of the invention, a recess exists when the layer thickness of the housing wall is less at this point in comparison with the customary layer thickness of the housing wall. A reduction by at least 50%, preferably in the range from 60 to 90%, has proven to be advantageous. In this range, the housing wall is, for example, only about 0.2 to 0.8 mm, preferably 0.3 to 0.6 mm, thick.

Consequently, the term recess covers notches, drilled holes, fissures and material deficits, in particular on the inner side of the housing wall, which do not penetrate as far as the outer surface of the housing wall.

By contrast with this, for the purposes of the invention, apertures are understood as meaning material deficits which reach from the inner surface to the outer surface of the housing wall, for example windows or drilled holes.

The recess preferably takes place only in the areas in which light-emitting elements are located and preferably in the form that the light-emitting elements can be introduced or fitted into the recess.

Circular recesses in the form of a drilled hole have proven to be favorable when using LEDs as light-emitting elements. The diameter of the drilled holes is usually slightly larger than the diameter of the light-emitting element and normally lies in the range from 2 to 6 mm, preferably 3 to 5 mm.

In principle, the distance of the light-emitting elements from the inner surface of the housing wall in the recess is arbitrary, but a small distance is to be preferred. The perception of the light-emitting elements in the emitting state through the housing wall can be localized particularly well if the distance of the light-emitting element from the inner surface of the housing wall in the recess lies in the range from 0.5 to 2 mm, preferably in the range from 0.7 to 1 mm.

The device according to the invention has no recesses, clearances and/or apertures on the outer surface, at least in the area of the display unit. This ensures a uniformly smooth surface, which can be easily cleaned.

Suitable materials for a housing of the device according to the invention comprise plastics in particular, such as polystyrene (PS), polycarbonate (PC), acrylonitrile-butadiene-styrene (ABS), polybutylene terephthalate (PBTP), styrene acrylonitrile (SAN), polyamide (PA), polyoxymethylene (POM), polyphenylene oxide (PPO), PE, PP, PTFE and homopolymers and copolymers of these plastics. The plastics may also be used in a filled or fiber-reinforced form.

Depending on the application area, the plastics may also be surface-coated, for example with paints, varnishes or lacquers.

The use of color plastics, for example colored with pigments, is also possible.

To ensure the optical perceptibility of the light-emitting elements through color materials, either the light power of the light-emitting elements must be increased or the wall thickness of the housing wall must be reduced, at least in the area of the display unit.

The production process for the housing of the device according to the invention is based on the materials used.

The housing of the device according to the invention is preferably produced by injection molding. However, production by machining, such as by milling from a shaped body, is also conceivable and possible.

The devices according to the invention can be used in all sectors in which a uniform, in particular easy to clean, surface is desirable.

The devices according to the invention are preferably used in the medical sector. In this sector, it is often of eminent importance that the devices can be easily and effectively cleaned, if appropriate disinfected.

The following may be mentioned as examples of such devices: exposing devices, mixing devices, in particular devices which are used in the dental sector.

The device may also be used to detect the presence, absence or identification of an item which is at a comparatively close distance in the area of the housing wall having the recess.

For this purpose, the housing wall of the device has, preferably more or less alongside the first recess, a further recess, in which an element suitable for the detection of electromagnetic radiation is located. Furthermore, the item is preferably to be formed on its outer surface in such a way that it is able to reflect in a suitable way the light radiated by the light-emitting element through the housing wall.

According to experience, the detection of the presence or absence of the item works all the better the closer the item is to the housing wall of the device. A usable distance lies in the range from 0.01 to 3 cm, preferably from 0.5 to 10 mm.

For its part, the item does not otherwise have to be individually identified any more specifically.

Suitable elements are, in particular, reflecting surfaces, specularly reflecting materials or else diffusely scattering materials.

The problem of determining the presence or absence of items or identifying their nature is known in principle. In this respect, reference is made to WO00/38841 or EP 0 699 582 A1. As a difference from the solutions proposed there, the present invention is distinguished by the fact that the detection system is of a comparatively simple construction and, as a result of the arrangement of the electrical components behind a housing wall which has no apertures, at least in this area, is very easy to clean, should this be necessary.

In one particular embodiment, the device is a mixing device, in particular for mixing dental impression compounds, such as that described for example in EP 0 492 413 B1. The items to be detected are in this case preferably containers or cartridges to be placed in the mixing device, as are described for example in EP 0787655 A2.

As soon as a cartridge has been placed in the mixing device, the type of container and the compound with which it is filled can be determined by the mixing device in a simple way and the mixing device can be controlled according to the container placed in.

In this way it is also possible to prevent unsuitable containers, which could lead to the mixing device being damaged during its operation, from being placed in the mixing device.

The device specified above, in particular in the form of a mixing device, consequently has, in the area of the receptacle for the containers to be placed in, a transmitter and a receiver, which are respectively located in recesses of the housing wall. The light emitted by the transmitter is reflected to a greater or lesser degree by the container to be placed in, according to the nature of the surface of the container. The reflected light is detected by the receiver and generates a signal there. In the simplest case, the container to be detected has on the surface a light/dark shadowing, for example in the form of a barcode, which can be applied in a simple way by means of an inkjet printer during the production of the container or parts thereof.

By providing, if appropriate, a number of transmitters and/or a number of receivers, it is possible in this way not only to detect the presence or absence of the container but also to transmit additional information on the container or the compound located in it.

The embodiment described is consequently distinguished by a series of advantages, such as simple construction of the detection system comprising a transmitting and reading unit using low-cost components, inexpensive application of a coding to a container and easier cleaning of the transmitting and reading unit in the event of soiling, since the device has no apertures, at least in this area.

BRIEF DESCRIPTION OF THE DRAWING

Preferred exemplary embodiments are explained below with reference to the drawings.

DETAILED DESCRIPTION OF THE DRAWING

Figure 1:
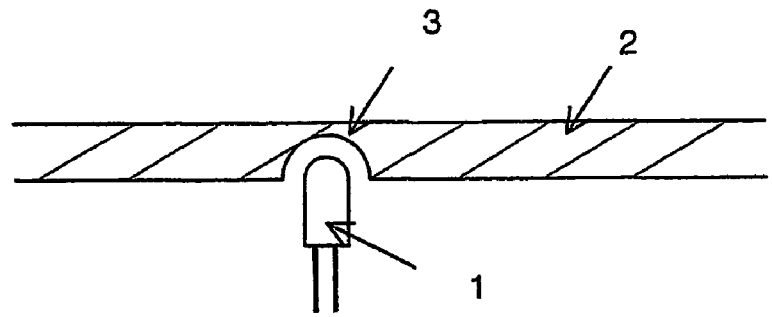
FIG. 1 shows a detail of one possible embodiment of the device in cross section.

The device according to the invention as shown in FIG. 1 comprises a light-emitting element (1), for example an LED, and a housing wall (2), which has in the area (3) in which the light-emitting element is arranged a recess on the inner side. The light-emitting element is in the present case partly let into the recess.

Figure 2:
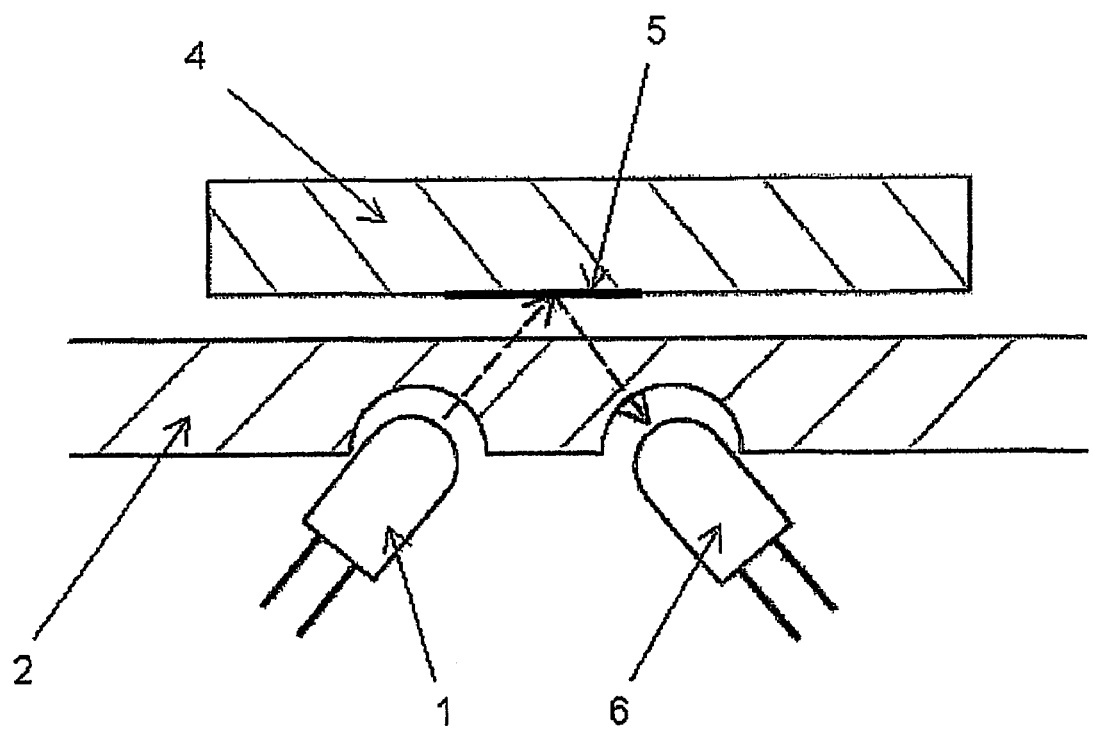
FIG. 2 shows a specific embodiment for a housing with a partially transparent housing.

In FIG. 2, opposite the light-emitting element (1) there is an item (4), with for example a reflecting surface area (5), which reflects the light radiated by the light-emitting element (1) through the housing wall (2) and reflects it onto the housing wall (2). There, it can be detected by an element (6) suitable for optical perception, for example a photocell, photodiode or a phototransistor, which has been let into a recess. In this way, the device is suitable for registering the presence or absence of an item which is located at comparatively close range in front of the housing wall.

The invention claimed is:

1. A device comprising:
a housing with a housing wall made of a plastic which, in normal lighting, precludes optical perception of an underlying dark surface, the housing wall having a uniformly smooth outer surface without recesses, clearances, or apertures and an inner surface, and
a display unit with at least one light-emitting element which transmits radiation that lies in a range of 400–700 nm and which is located inside the housing, beneath the inner surface of the housing wall,
wherein the housing wall has at least one recess or a reduced wall thickness, but no apertures, in an area of the light-emitting element,
wherein the light intensity of the at least one light-emitting element is adjusted in such a way that, in the emitting state, lighting other than said normal lighting is produced and the at least one light-emitting element is optically perceptible in a localizable manner through the housing wall only in the area of the light-emitting element, and
wherein the housing wall has said at least one recess and at least one further recess, into which a detector is let, which makes it possible to detect the light by the light-emitting element through the housing wall onto an item and the light reflected by the item through the housing wall.

2. Use of the device as claimed in claim 1 for determining the presence, absence or nature of items.

3. Use of items in conjunction with a device as claimed in claim 1, it being possible for the presence, absence or nature of the items to be determined by the device.

4. The device as claimed in claim 1, the device being chosen from a medical device, a mixing device or a charging device.

5. A device comprising:
a housing with a housing wall made of a plastic which, in normal lighting, precludes optical perception of an underlying dark surface, the housing wall having a uniformly smooth outer surface without recesses, clearances, or apertures and an inner surface, and
a display unit with at least one light-emitting element which transmits radiation that lies in a range of 400–700 nm and which is located inside the housing, beneath the inner surface of the housing wall,
wherein the housing wall has at least one recess or a reduced wall thickness, but no apertures, in an area of the light-emitting element,
wherein the light intensity of the at least one light-emitting element is adjusted in such a way that, in the emitting state, lighting other than said normal lighting is produced and the at least one light-emitting element is optically perceptible in a localizable manner through the housing wall only in the area of the light-emitting element,
wherein the housing wall thickness being less in the area of the recess by at least 50% in comparison with the remaining average housing wall thickness, and
wherein the housing wall has said at least one recess and at least one further recess, into which a detector is let, which makes it possible to detect the light by the light-emitting element through the housing wall onto an item and the light reflected by the item through the housing wall.

6. A device comprising:
a housing with a housing wall made of a plastic which, in normal lighting, precludes optical perception of an underlying dark surface, the housing wall having a uniformly smooth outer surface without recesses, clearances, or apertures and an inner surface, and
a display unit with at least one light-emitting element which transmits radiation that lies in a range of 400–700 nm and which is located inside the housing, beneath the inner surface of the housing wall,
wherein the housing wall has at least one recess or a reduced wall thickness, but no apertures, in an area of the light-emitting element,
wherein the light intensity of the at least one light-emitting element is adjusted in such a way that, in the emitting state, lighting other than said normal lighting is produced and the at least one light-emitting element is optically perceptible in a localizable manner through the housing wall only in the area of the light-emitting element,
wherein the plastic is disinfectable, and
wherein the housing wall has said at least one recess and at least one further recess, into which a detector is let, which makes it possible to detect the light by the light-emitting element through the housing wall onto an item and the light reflected by the item through the housing wall.

7. A device comprising:
a housing with a housing wall made of a plastic which, in normal lighting, precludes optical perception of an underlying dark surface, the housing wall having a uniformly smooth outer surface without recesses, clearances, or apertures and an inner surface, and
a display unit with at least one light-emitting element which transmits radiation that lies in a range of 400–700 nm and which is located inside the housing, beneath the inner surface of the housing wall, wherein the housing wall has at least one recess or a reduced wall thickness, but no apertures, in an area of the light-emitting element, wherein the light intensity of the at least one light-emitting element is adjusted in such a way that, in the emitting state, lighting other than said normal lighting is produced and the at least one light-emitting element is optically perceptible in a localizable manner through the housing wall only in the area of the light-emitting element, wherein the plastic is chosen from polystyrene (PS), polycarbonate (PC), acrylonitrile-butadiene-styrene (ABS), polybutylene terephthalate (PBTP), styrene acrylonitrile (SAN), polyamide (PA), polyoxymethylene (POM), polyphenylene oxide (PPO), PE, PP, PTFE and homopolymers and copolymers of these plastics, or comprises such plastics, and wherein the housing wall has said at least one recess and at least one further recess, into which a detector is let, which makes it possible to detect the light by the light-emitting element through the housing wall onto an item and the light reflected by the item through the housing wall.

8. A device comprising:

a housing with a housing wall made of a plastic which, in normal lighting, precludes optical perception of an underlying dark surface, the housing wall having a uniformly smooth outer surface without recesses, clearances, or apertures and an inner surface, and a display unit with at least one light-emitting element which transmits radiation that lies in a range of 400–700 um and which is located inside the housing, beneath the inner surface of the housing wall, wherein the housing wall has at least one recess or a reduced wall thickness, but no apertures, in an area of the light-emitting element, wherein the light intensity of the at least one light-emitting element is adjusted in such a way that, in the emitting state, lighting other than said normal lighting is produced and the at least one light-emitting element is optically perceptible in a localizable manner through the housing wall only in the area of the light-emitting element, wherein the at least one light-emitting element is let into the at least one recess, and wherein the housing wall has said at least one recess and at least one further recess, into which a detector is let, which makes it possible to detect the light by the light-emitting element through the housing wall onto an item and the light reflected by the item through the housing wall.

* * * * *